United States Patent
Magstadt et al.

(10) Patent No.: US 12,489,434 B1
(45) Date of Patent: Dec. 2, 2025

(54) SINGLE CLOCK DELAY STEP IN MULTI-STAGE SWITCHED-CAPACITOR DELAYS

(71) Applicant: National Technology & Engineering Solutions of Sandia, LLC, Albuquerque, NM (US)

(72) Inventors: Benjamin Magstadt, Kansas City, MO (US); Travis Forbes, Overland Park, KS (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 161 days.

(21) Appl. No.: 18/616,962

(22) Filed: Mar. 26, 2024

(51) Int. Cl.
*H03K 5/134* (2014.01)
*H03K 5/131* (2014.01)
*H03K 5/00* (2006.01)

(52) U.S. Cl.
CPC ............ *H03K 5/134* (2014.07); *H03K 5/131* (2013.01); *H03K 2005/00071* (2013.01)

(58) Field of Classification Search
CPC .................. H03K 5/134; H03K 5/131; H03K 2005/00071
USPC ........................................................ 327/261
See application file for complete search history.

(56) References Cited

U.S. PATENT DOCUMENTS

| | | | | |
|---|---|---|---|---|
| 8,164,380 B2 * | 4/2012 | Hosokawa | ............ | H03H 15/00 327/554 |
| 8,570,100 B2 * | 10/2013 | Morishita | ............ | H03H 15/023 455/313 |
| 9,318,999 B2 * | 4/2016 | Morishita | ............ | H03H 19/004 |
| 11,683,023 B1 * | 6/2023 | Forbes | ............ | H03H 11/265 327/278 |
| 12,095,424 B1 * | 9/2024 | Forbes | ............ | H03F 3/45179 |
| 2014/0264050 A1 * | 9/2014 | Rostaing | ............ | H03H 11/265 250/371 |

OTHER PUBLICATIONS

Garakoui, S. K. et al., "A 1-to-2.5GHz Phased-Array IC Based on gm-RC All-Pass Time-Delay Cells," ISSCC 2012, Session 4, RF Techniques, 4.4, 3 pages.

(Continued)

*Primary Examiner* — Ryan Jager
(74) *Attorney, Agent, or Firm* — Mark A. Dodd

(57) ABSTRACT

A programmable delay device providing a delay resolution of less than 1 ns and a maximum delay of >100 ns over a broad bandwidth is disclosed. The device includes an input stage with M sampling switched capacitor elements, reducing the sampling rate by M. The device includes a programmable delay stage with M programmable switched capacitor banks, each bank having N delay switched capacitor storage elements. The programmable delay stage includes a total of M×N delay switched capacitor storage elements, reducing the sampling rate by M×N. This reduced sampling rate permits smaller sampling switches, with reduced leakage current and longer programmable delay times. The device includes an output reconstruction stage that reconstructs a delayed version of the input signal by combining signals from the programmable delay stage. The sampling clocks for the input and output reconstruction stages are independent, allowing a delay resolution corresponding to the sampling rate.

20 Claims, 5 Drawing Sheets

(56) References Cited

OTHER PUBLICATIONS

Mondal, I. et al., "A 2-GHz Bandwidth, 0.25-1.7 ns True-Time-Delay Element Using a Variable-Order All-Pass Filter Architecture in 0.13 μm CMOS," IEEE Journal of Solid-State Circuits (2017) 52(8):2180-2193.

Nagulu, A. et al., "Full-Duplex Receiver with Wideband Multi-Domain FIR Cancellation Based on Stacked-Capacitor, N-Path Switched-Capacitor Delay Lines Achieving >54dB SIC Across 80MHz BW and >15dBm TX Power-Handling," ISSCC 2021, Session 6, 3 pages.

\* cited by examiner

SINGLE CLOCK DELAY STEP IN MULTI-STAGE SWITCHED-CAPACITOR DELAYS

STATEMENT OF GOVERNMENT SUPPORT

This invention was made with Government support under Contract No. DE-NA0003525 awarded by the United States Department of Energy/National Nuclear Security Administration. The U.S. Government has certain rights in the invention.

BACKGROUND OF THE INVENTION

Field of the Invention

The present invention generally relates to switched capacitor delays, and specifically relates to multi-stage switched capacitors that can achieve a single clock delay step.

Brief Description of the Related Art

Full-duplex (FD) RF wireless has seen significant interest to increase spectral efficiency as the transmitter (TX) and receiver (RX) operate at the same frequency and time. Large (>100 dB) cancellation of the TX signal arriving in-band at the RX input through limited TX-RX isolation and radar-like reflections from objects is required for deployment. Recent efforts utilized finite impulse response (FIR) time-domain equalizer-based self-interference cancelation (SIC) techniques, which employ RF delay elements and gain weighting for SIC. Greater than 100 ns of delay is desired to cover a full FD delay spread, which could counter reflections from objects within 50 feet. Prior art devices have demonstrated RF delays of less than 8 ns, corresponding to reflections from objects within 4 feet, resulting in TX reflections from nearby objects that saturate the RX before additional cancellation in the baseband can be applied. For a TX operating at 900 MHz with a transmission power of 27 dBm, objects at 4 ft, 20 ft, and 50 ft will produce reflected powers of >1 dBm, >−27 dBm, and >−42 dBm, respectively. For objects at distances of less than 50 ft, the high reflected power levels would saturate the RF front end before additional cancellation could be applied further along in the baseband chain. For this reason, FD wireless systems need hundreds of ns of delay for sufficient RF cancellation. Furthermore, this example is for a single reflecting object, whereas a real environment will include many reflecting objects.

The need for appreciable RF delays is not limited to FD RF wireless applications. For example, programmable delays of greater than 100 ns may also be employed with radar testers, analog correlators and FIR filters, and digital RF memories.

To date, >100 ns of RF delay has been achieved in acoustic delay lines. These acoustic delay lines, however, have a narrow bandwidth and do not provide a programmable delay. Thus, acoustic delay lines are typically limited to applications such as large radar and communication systems.

Alternatives to acoustic delay lines include $g_m$-C all-pass filters and switched-capacitor circuits. While $g_m$-C all-pass filters can achieve more than a factor of twenty increase in area efficiency (ns of delay per square mm of circuitry) compared to delay lines, they are limited to <2 ns delays. See S. Garakoui et al., "A 1-to-2.5 GHz Phased-Array IC Based on $g_m$-RC All-Pass Time-Delay Cells," IEEE International Solid-State Circuits Conference, pp. 80-82 (2012) and I. Mondal and N. Krishnapura, "A 2-GHz Bandwidth, 0.25-1.7 ns True-Time-Delay Element Using a Variable-Order All-Pass Filter Architecture in 0.13 μm CMOS," IEEE Journal of Solid-State Circuits, vol. 52, no. 8, pp. 2180-2193 (2017). Switched-capacitor circuits have achieved an additional factor of five increase in area efficiency, but are limited to <8 ns RF delays. This delay duration is limited by the complexity of the required RF clock generation, capacitive loading with increased number of switch capacitor cells, and sample leakage through large sampling switches. See A. Nagulu et al., "Full-Duplex Receiver with Wideband Multi-Domain FIR Cancellation Based on Stacked-Capacitor N-Path Switched-Capacitor Delay Lines Achieving>54 dB SIC Across 80 MHz BW and >15 dBm TX Power-Handling," IEEE International Solid-State Circuits Conference, pp. 100-102 (2021).

U.S. Pat. No. 11,683,023, assigned to the same assignee as this application, discloses a delay device that can provide programmable delay of more than 100 ns over a broad bandwidth. However, the minimum delay resolution possible with the delay device disclosed in U.S. Pat. No. 11,683,023 is $8/F_S$, where there are eight sampling switched capacitor storage elements and $F_S$ is the sampling clock frequency. In certain applications, this minimum possible delay resolution may be too long. For example, within full duplex applications, a small delay resolution is desired in order to fully cancel environmental reflections in the scene at all distances. Further, in broadband phased array applications, the minimum delay resolution sets the minimum beam steering phase. Thus, the need exists for a programmable delay device that can implement a minimum delay resolution time of less than $8/F_S$.

SUMMARY OF THE INVENTION

One aspect of the present invention relates to a programmable delay device that provides a minimum delay resolution of less than 1 ns, while maintaining a maximum delay of more than 100 ns over a broad bandwidth (>500 MHZ). To accomplish this, the programmable delay device includes an input stage that employs M sampling switched capacitor storage elements such that while the input RF signal is sampled at a frequency $F_S$, each individual sampling switched capacitor storage element samples at a rate of only $F_S/M$. The programmable device further includes a programmable delay stage with M programmable switched capacitor banks, with each programmable switched capacitor bank having N delay switched capacitor storage elements. Thus, the programmable delay stage includes a total of M×N delay switched capacitor storage elements, thereby effecting an M×N reduction in the sampling rate at the individual delay switched capacitor storage element level. This reduced sampling rate permits the use of much smaller sampling switches, resulting in reduced leakage current and the ability to implement far longer programmable delay times. The programmable delay device includes an output reconstruction stage that reconstructs a programmably delayed version of the input RF signal by reconstructing signals from the programmable delay stage. To produce a minimum delay resolution time of $1/F_S$, the programmable delay device employs independent clocks for the input and output reconstruction stages, each of which is generated from the same master clock operating at $F_S$.

In at least a first embodiment, a programmable delay device comprises an input sampling stage (the input sample stage receiving an input sampling clock at a frequency $F_S$ and an input RF signal, the input sampling stage including M sampling switched capacitor storage elements, the M sampling switched capacitor storage elements sequentially sampling and holding a corresponding portion of the input RF signal, the thus sampled and held portions of the input RF signal being input sampled signals), a programmable delay stage (the programmable delay stage including M programmable switched capacitor banks, each programmable switched capacitor bank including N delay switched capacitor storage elements, each delay switched capacitor storage element sampling and holding a corresponding time interleaved portion of a corresponding input sampled signal, the thus sampled and held signals being delay sampled switched signals), a programmable enable delay circuit (the programmable enable delay circuit receiving a desired fine delay value and the input sampling clock, the programmable enable delay circuit generating an enable output signal with a time delay based upon the desired fine delay value, an incremental fine delay value corresponding to $1/F_S$, the programmable enable delay circuit outputting the enable output signal and the input sampling clock as an output clock), an enable timing circuit (the enable timing circuit receiving a desired coarse delay value, the enable output signal, and the output clock, the enable timing circuit including a digital counter, the digital counter counting to the desired coarse delay value, upon reaching the desired coarse delay value the enable timing circuit outputting a corresponding output reconstruction clock, an incremental coarse delay value corresponding to $M/F_S$), and an output reconstruction stage (the output reconstruction stage including M output reconstruction switches, each output reconstruction switch coupled to a corresponding delay output switch, each output reconstruction switch outputting a corresponding time interleaved delay sampled switched signal based upon the output reconstruction clock, the thus output time interleaved delay sampled switched signals being output reconstruction signals, the output reconstruction stage outputting the output reconstruction signals in a sequential manner thereby generating a reconstructed output RF signal).

In various embodiments, the programmable delay device further comprises a selectable clock divider (the selectable clock divider receiving an input clock, dividing the input clock by P, and outputting the thus generated divide-by-P clock to the input sampling stage as the input sampling clock); M is equal to or greater than 4; each sampling switched capacitor storage element includes an input sampling capacitor (the input sampling capacitor holding a corresponding input sampled signal), and an input sampling switch (the input sampling switch sequentially coupling the input RF signal to the input sampling capacitor); N is equal to or greater than 2; and each delay switched capacitor storage element includes a switched bank sampling capacitor (the switched bank sampling capacitor holding a corresponding delay sampled switched signal), and an input switched bank switch (the input switched bank switch coupling a corresponding input sampled signal to the switched bank sampling capacitor in a time interleaved manner).

In other embodiments, the input sampling stage further includes M intervening buffers (each intervening buffer coupling a corresponding sampling switched capacitor storage element to a corresponding programmable switched capacitor bank); the programmable delay stage further includes M×N delay buffers (each delay buffer coupling a corresponding delay switched capacitor storage element to a corresponding delay output switch); the programmable enable delay circuit includes a plurality of flip-flops (the plurality of flip-flops generating the enable output signal in accordance with the desired fine delay value, the enable output signal including an inherent delay due to one or more of the plurality of flip-flops); the programmable enable delay circuit further includes one or more second flip-flops (the one or more second flip-flops generating an enable input signal, the enable input signal including a second inherent delay due to the one or more second flip-flops, the second inherent delay due to the one or more second flip-flops substantially equal to the inherent delay due to the one or more of the plurality of flip-flops, the programmable enable delay circuit outputting the enable input signal to the input sampling stage); and the programmable enable delay circuit further outputs the enable output signal to the input sampling stage and the input sampling stage and the enable timing circuit start in different initialization states corresponding to the desired fine delay value.

In yet other embodiments, the output reconstruction stage further includes M self-biased inverter load (each self-biased inverter load coupling a corresponding delay output switch to a corresponding output reconstruction switch); the input sampling stage further includes an input divide-by-M clock (the input divide-by-M clock receiving the input sampling clock, dividing the input sampling clock by M, and outputting M thus generated input divide-by-M clocks), the programmable delay stage further includes M input divide-by-N clocks (each input divide-by-N clock receiving a corresponding input divide-by-M clock, dividing the corresponding input divide-by-M clock by N, and outputting N thus generated input divide-by-N clocks), each sampling switched capacitor storage element operating by a corresponding input divide-by-M clock, and each delay switched capacitor storage element operating by a corresponding input divide-by-N clock; the input sampling stage further includes an input pulse extend clock (the input pulse extend clock receiving the M input divide-by-M clocks, lengthening a pulse length of each input divide-by-M clock, and outputting M thus generated input pulse extended clocks to the M input divide-by-N clocks as corresponding input divide-by-M clocks); the enable timing circuit further includes an output divide-by-M clock (the output divide-by-M clock receiving the output clock, dividing the output clock by M, and outputting M thus generated output divide-by-M clocks, the programmable delay stage further includes M output divide-by-N clocks (each output divide-by-N clock receiving a corresponding output divide-by-M clock, dividing the corresponding output divide-by-M clock by N, and outputting N thus generated output divide-by-N clocks), each output reconstruction switch operating by a corresponding output divide-by-M clock, and each delay output switch operating by a corresponding output divide-by-N clock; and the enable timing circuit further includes an output pulse extend clock (the output pulse extend clock receiving the M output divide-by-M clocks, lengthening a pulse length of each output divide-by-M clock, and outputting M thus generated output pulse extended clocks as corresponding output divide-by-M clocks).

In still other embodiments, the programmable delay device further comprises a serial programming interface (the serial programming interface receiving the desired fine delay value and the desired coarse delay value from an external programming source, outputting the desired fine delay value to the programmable enable delay circuit, and outputting the desired coarse delay value to the enable timing circuit); at least a portion of the programmable delay device is implemented with CMOS circuitry, at least a portion of the programmable delay device is implemented in either a single-ended configuration or a differential configuration; and the programmable delay device has an area efficiency of greater than 100 ns/mm$^2$.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 3A illustrates a block diagram, while

DETAILED DESCRIPTION OF THE INVENTION

The terms "a" and "an" do not denote a limitation of quantity, but rather denote the presence of at least one of the referenced items. The term "or" means "and/or." The terms "comprising," "having," "including," and "containing" are to be construed as open-ended terms (i.e., meaning "including, but not limited to").

Figure 1:
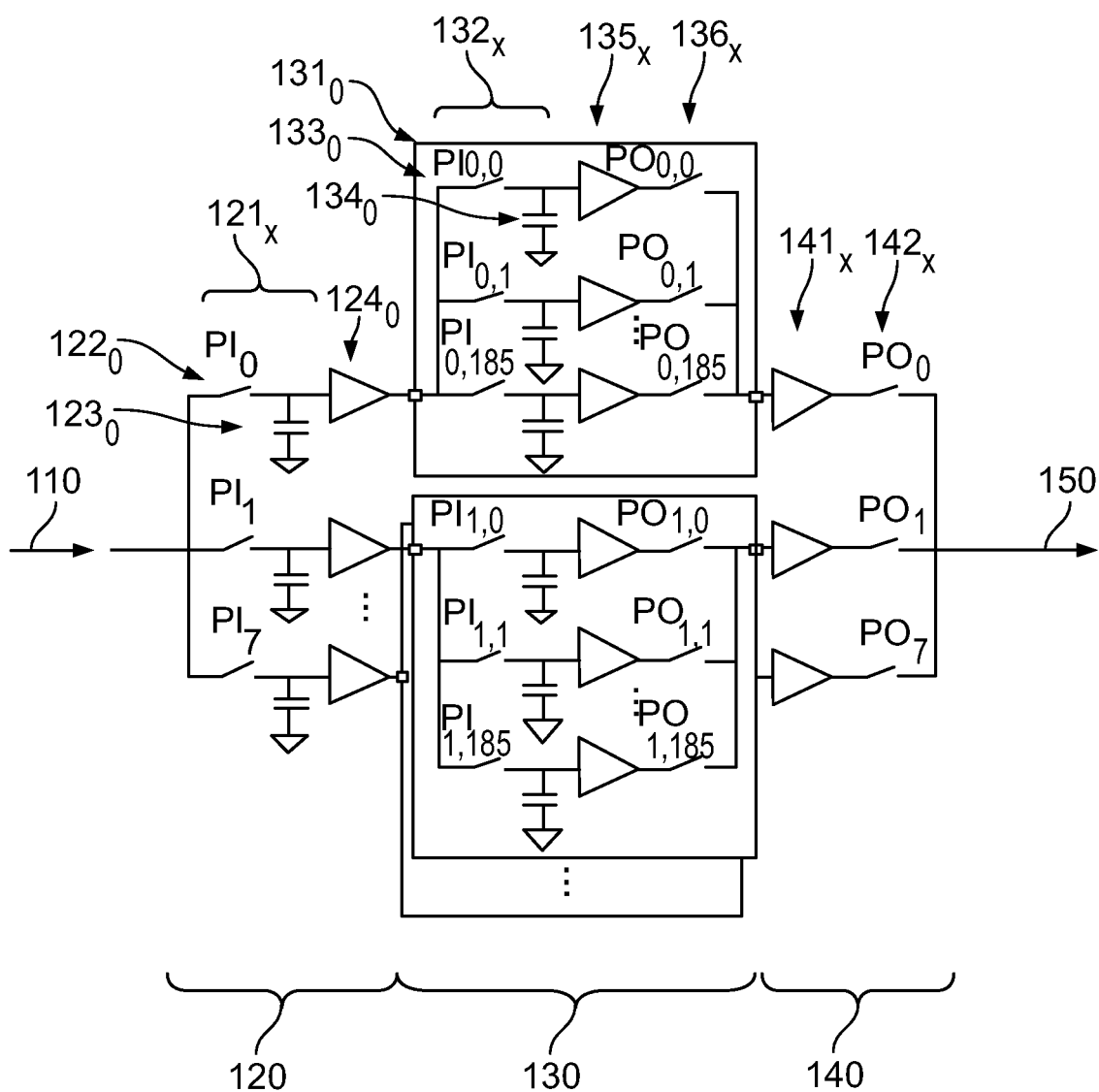
FIG. 1 illustrates a single-ended programmable delay device in accordance with one or more embodiments of the present invention.

FIG. 1 illustrates a single-ended configuration programmable delay device 100 in accordance with one or more embodiments employing a time-interleaved multistage switched-capacitor (TIMS-SC) architecture. The programmable delay device is preferably implemented in a differential manner as described below with reference to FIG. 3. The programmable delay device 100 includes an input sampling stage 120 of eight sampling switched capacitor storage elements $121_0$-$121_7$. Each sampling switched capacitor storage element $121_0$-$121_7$ includes a corresponding input sampling switch $122_0$-$122_7$ and corresponding input sampling capacitor $123_0$-$123_7$. The eight sampling switched capacitor storage elements $121_0$-$121_7$ are sequentially coupled to an input RF signal 110 via corresponding input sampling switches $122_0$-$122_7$, thereby sequentially sampling the input RF signal 110. For example, sampling switched capacitor storage element $121_0$ temporarily stores samples 1, 9, etc., while sampling switched capacitor storage element $121_1$ temporarily stores samples 2, 10, etc. This sampling process will be described below with respect to FIG. 2. The signals held by the eight sampling switched capacitor storage elements $121_0$-$121_7$ are termed input sampled signals. Each of the eight sampling switched capacitor storage elements $121_0$-$121_7$ is coupled to a corresponding programmable switched capacitor bank $131_0$-$131_7$ in a programmable delay stage 130 via a corresponding buffer $124_0$-$124_7$.

In this illustrated embodiment, the input sampling stage 120 is an 8-phase switched capacitor network sampling at the full sampling rate of $F_S$. While the input sampling stage 120 illustrated in FIG. 1 has eight input sampling switched capacitor storage elements $121_0$-$121_7$, i.e., is an 8-phase switched capacitor network, other embodiments may have an input sampling stage with M sampling switched capacitor storage elements, resulting in an M-phase switched capacitor network. In these embodiments, M may be smaller or larger than 8, though M is preferrable 4 or greater. Further, in this embodiment with eight programmable switched capacitor banks $131_0$-$131_7$, each programmable switched capacitor bank $131_0$-$131_7$ has a sampling rate of $F_S/8$.

As illustrated in FIG. 1, each programmable switched capacitor bank $131_0$-$131_7$ includes 186 delay switched capacitor storage elements $132_0$-$132_{185}$. Each delay switched capacitor storage element $132_0$-$132_{185}$ includes a corresponding input switched bank switch $133_0$-$133_{185}$ and corresponding switched bank sampling capacitor $134_0$-$134_{185}$. The 186 delay switched capacitor storage elements $132_0$-$132_{185}$ are coupled to a corresponding buffer $124_0$-$124_7$ via corresponding input switched bank switches $133_0$-$133_{185}$ in a time interleaved manner, thereby sampling a corresponding input sampled signal. Thus, the programmable delay stage 130 includes a total of 8×186=1,488 delay switched capacitor storage elements, i.e., 1,488 input switched bank switches and 1,488 switched bank sampling capacitors. The signals held by the 1,488 delay switched capacitor storage elements are termed delay sampled switched signals. Each delay switched capacitor storage element $132_0$-$132_{185}$ is coupled to a corresponding delay buffer $135_0$-$135_{185}$ and delay output switch $136_0$-$136_{185}$.

While the programmable delay stage 130 illustrated in FIG. 1 has eight programmable switched capacitor banks $131_0$-$131_7$, other embodiments may have a programmable delay stage with M programmable switched capacitor banks. In these embodiments, M may be smaller or larger than 8, though the number of programmable switched capacitor banks in the programmable delay stage must equal the number of sampling switched capacitor storage elements in the input sampling stage. Further, while each programmable switched capacitor bank $131_0$-$131_7$ illustrated in FIG. 1 includes 186 delay switched capacitor storage elements $132_0$-$132_{185}$, other embodiments may have programmable switched capacitor banks with N delay switched capacitor storage elements. In these embodiments, N may be smaller or larger than 186, with a larger value for N resulting in a greater range of programmable delay times and a larger physical device. N is preferably 64 or greater.

Each of the eight programmable switched capacitor banks $131_0$-$131_7$ is coupled to a corresponding output reconstruction switch $142_0$-$142_7$ via a corresponding optional output buffer $141_0$-$141_7$ in an output reconstruction stage 140. The signals output by the eight optional output buffer $141_0$-$141_7$ are termed output reconstruction signals. In this embodiment, the output reconstruction stage 140 is an 8-phase switching network operating at the full sampling rate of $F_S$. The output reconstruction stage 140, based on the sequential switching of the output reconstruction switches $142_0$-$142_7$, outputs a reconstructed delayed output RF signal 150 that corresponds to a programmed time delayed version of the input RF signal 110.

The programmable delay device 100 illustrated in FIG. 1 includes a first set of eight buffers $123_0$-$123_7$ between the input sampling stage 120 and the programmable delay stage 130, along with a second set of eight optional output buffers $141_0$-$141_7$ between the programmable delay stage 130 and the output reconstruction stage 140. The programmable delay device 100 further includes delay buffers $135_0$-$135_{185}$ in each of the eight programmable switched capacitor banks $131_0$-$131_7$. In other embodiments, these delay buffers $135_0$-$135_{185}$ may be deleted leading to a passive implementation, thereby creating a tradeoff between power consumption, loss of gain, area, and area efficiency.

Figure 2:
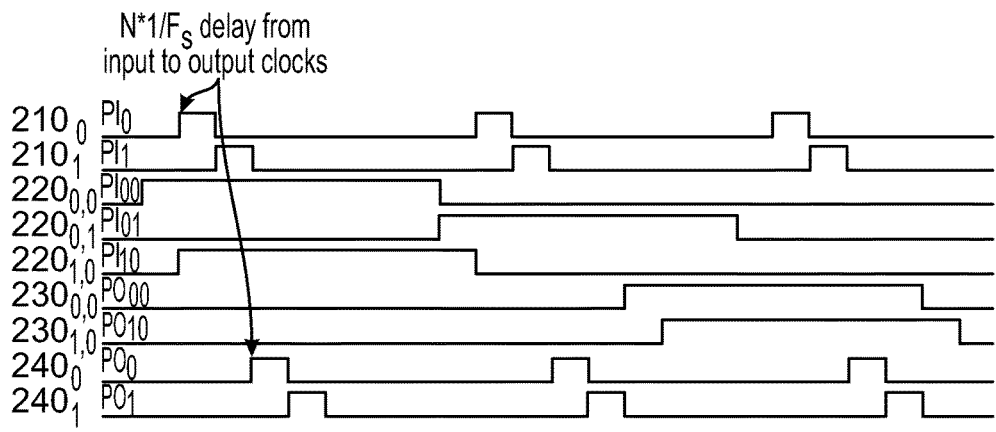
FIG. 2 illustrates a timing diagram for a programmable delay device in accordance with one or more embodiments of the present invention.

FIG. 2 illustrates a timing diagram 200 for the programmable delay device 100 illustrated in FIG. 1. The first two lines $210_0$, $210_1$ of the timing diagram 200 correspond to the sampling of the input signal 110 by the first two sampling switched capacitor storage elements $121_0$, $121_1$ via input sampling switches $122_0$, $122_1$, i.e., clocks $PI_0$ and $PI_1$. The next three lines $220_{0,0}$, $220_{0,1}$, $220_{1,0}$ correspond to the sampling of the signals output by the first two sampling switched capacitor storage elements $121_0$, $121_1$ by the first two delay switched capacitor storage elements $132_0$, $132_1$ of the first programmable switched capacitor bank $131_0$, i.e., clocks $PI_{0,0}$ and $PI_{0,1}$, and the first delay switched capacitor storage element $132_0$ of the second programmable switched capacitor bank $131_1$, i.e., clock $P_{1,0}$, respectively. The next two lines $230_{0,0}$, $230_{1,0}$ of the timing diagram 200 correspond to the output timing of the first delay switched capacitor storage element $132_0$ of the first programmable switched capacitor bank $131_0$ and the first delay switched capacitor storage element $132_0$ of the second programmable switched capacitor bank $131_1$, i.e., clocks $P0_{0,0}$ and $P0_{1,0}$, respectively. The last two lines $240_0$, $240_1$ of the timing diagram 200 correspond to the output timing of the first output reconstruction switch $142_0$ and the second output reconstruction switch $142_1$, i.e., clocks $P0_0$ and $P0_1$, respectively.

As reflected by the first two lines $210_0$, $210_1$, the input signal 110 is sampled at a sampling rate of $F_S$ with a period of $T=1/F_S$, with the first two sampling switched capacitor storage elements $121_0$, $121_1$ sampling the first T and second T of the input signal 110, respectively. The first line $210_0$ shows the sampling of the input signal 110 that generates input sampled signals 1, 9, 17, etc., while the second line $210_1$ shows the sampling of the input signal 110 that generates input sampled signals 2, 10, 18, etc. The third line $220_{0,0}$ shows the storage of input sampled signal 1 by the first delay switched capacitor storage element $132_0$ in the first programmable switched capacitor bank $131_0$ as delay sampled switched signal 1. The fourth line $220_{0,1}$ shows the storage of input sampled signal 9 by the second delay switched capacitor storage element $132_1$ in the first programmable switched capacitor bank $131_0$ as delay sampled switched signal 9. The fifth line $220_{1,0}$ shows the storage of input sampled signal 2 by the first delay switched capacitor storage element $132_0$ in the second programmable switched capacitor bank $131_1$ as delay sampled switched signal 2. The sixth line $230_{0,0}$ shows the passing of delay sampled switched signal 1, while the seventh line $230_{1,0}$ shows the passing of delay sampled switched signal 2. The eighth line $240_0$ shows the passing of delay sampled switched signal 1 stored by the first delay switched capacitor storage element $132_0$ in the first programmable switched capacitor bank $131_0$ to the output reconstruction switch $142_0$ via the output buffer $141_0$ as output reconstruction signal 1. The ninth line $240_1$ shows the passing of delay sampled switched signal 2 stored by the first delay switched capacitor storage element $132_0$ in the second programmable switched capacitor bank $131_1$ to the output reconstruction switch $142_1$ via the output buffer $141_1$ as output reconstruction signal 2. Of particular note is that the delay between the input clocks $PI_0$ and $PI_1$ (lines $210_0$, $210_1$) and the output clocks $PO_0$ and $PO_1$ (lines $240_0$ and $240_1$) is programmable with a minimum delay resolution time of $1/F_S$. This is in contrast to the minimum delay step disclosed in U.S. Pat. No. 11,683,023, which was $8/F_S$, i.e., the minimum programmable delay resolution time with various embodiments of the present invention is a factor of eight smaller.

While the settling time T is $1/F_S$ in the input sampling stage 120, settling time expansion is created in the programmable delay stage 130 by allowing sample transfer from the input sampling stage 120 to the programmable delay stage 130 to continue during the input sampling stage 120 hold time. With the expanded sample time, the sampler bandwidth required in the programmable delay stage 130 is greatly reduced. This allows the use of much smaller input switched bank switches $133_0$-$133_{185}$ in the delay switched capacitor storage elements $132_0$-$132_{185}$ of the programmable delay stage 130, which in turn enables a large reduction in OFF state sample leakage. This leakage reduction enables a corresponding increase in the maximum achievable hold time, which is key to achieving more than 100 ns of delay. (The programmable delay device 100 illustrated in FIG. 1 achieved a maximum delay of approximately 450 ns at a sampling frequency $F_S$ of 3.3 GHZ.)

To reduce timing skew sensitivity, the programmable delay stage 130 input clock signal $PI_{x,y}$ transitions prior to the input sampling stage 120 input sample clock signal $PI_x$, where x corresponds to the path in the input sampling stage 120 (i.e., it has a value from 0 to 7) and y corresponds to the path in the programmable delay stage 130 (i.e., it has a value from 0 to 185). Thus, the programmable delay stage 130 input is static during clock transitions (e.g., $PI_{1,0}$ before $PI_1$). After the programmed delay, a programmable delay stage 130 output clock signal $P0_{x,y}$ initiates the transfer of the delay sampled switched signal to the input of the corresponding output buffer $141_0$-$141_7$, again time expanded. The output buffers $141_0$-$141_7$ output the delay sampled switched signals employing an 8-phase clock timing ($PO_x$) that, while based upon the same master clock as the input sampling stage 120 ($PI_x$), is independent thereof, to output reconstruction signals. Timing skew is again mitigated by transitioning the programmable delay stage 130 output clock signal $PO_{x,y}$ after the output reconstruction stage 140 output clock signal $PO_x$. The input ($PI_{x,y}$) and output ($PO_{x,y}$) clocks in the programmable delay stage 130 are generated by two separate, but synchronous, divide-by-186 clocks, as will be described below with reference to FIG. 3. The delay is programmed by delaying the enable timing (described below with reference to FIG. 3) of the programmable delay stage 130 output clock signal $PO_{x,0}$ relative to the associated input clock signal $PI_{x,0}$. For the programmable delay device 100 illustrated in FIG. 1, the delay can be programmed over a range from $8/F_S$ to $1480/F_S$ (in $1/F_S$ increments) and scales with the sample frequency $F_S$.

Figure 3A:
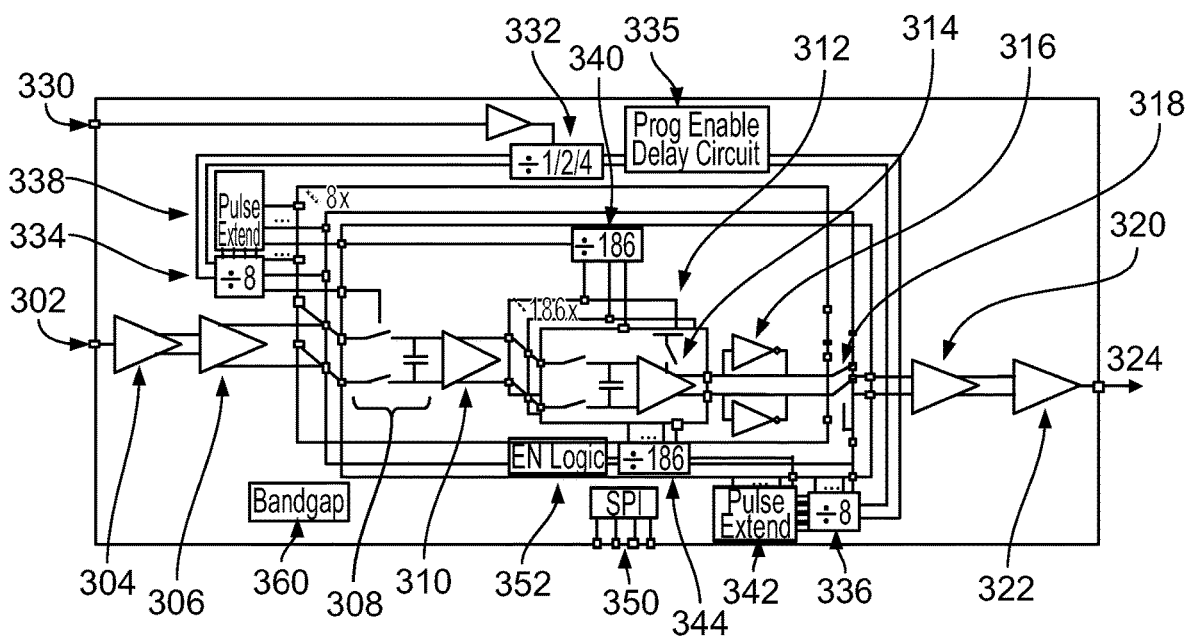
Figure 3B:
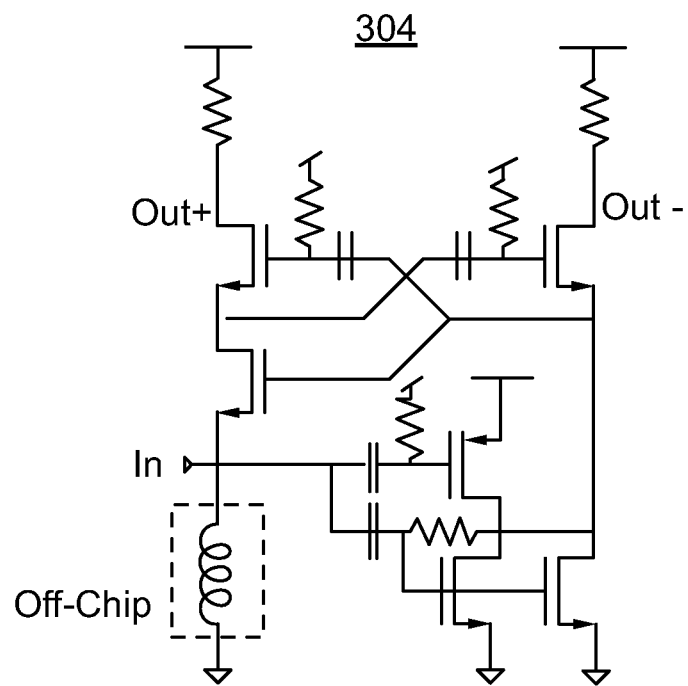
FIGS. 3B-3F illustrate corresponding circuit diagrams, for a differential embodiment of a programmable delay device in accordance with one or more embodiments of the present invention.
Figure 3C:
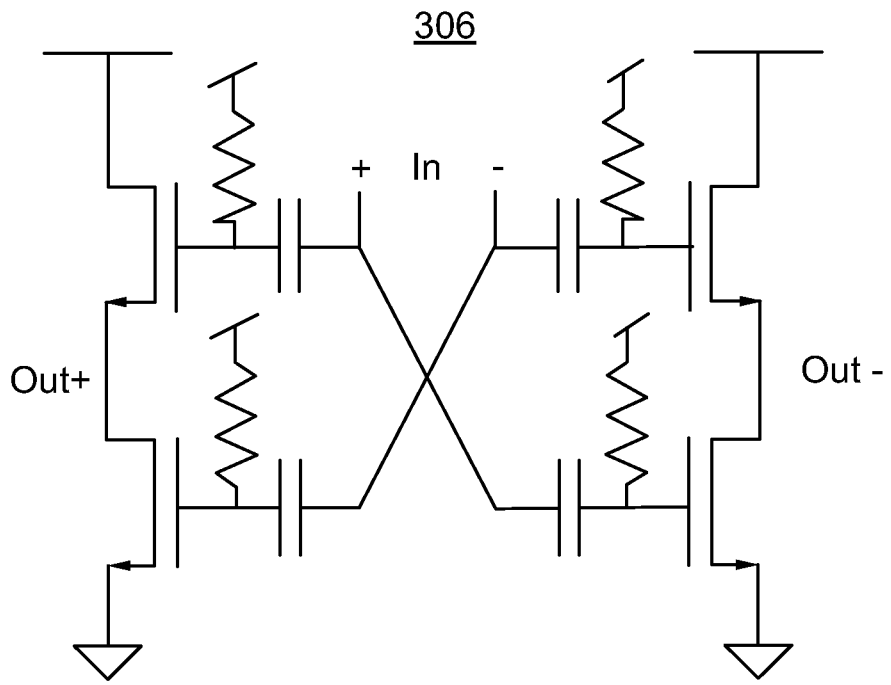
Figure 3D:
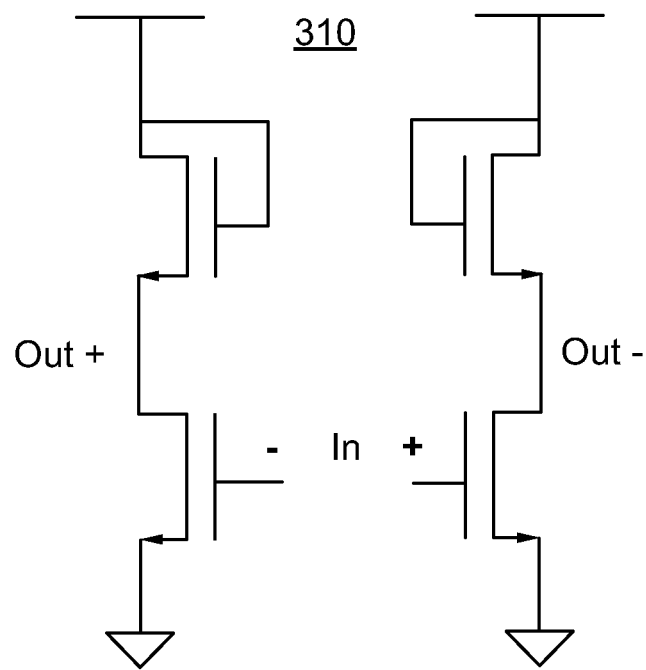
Figure 3E:
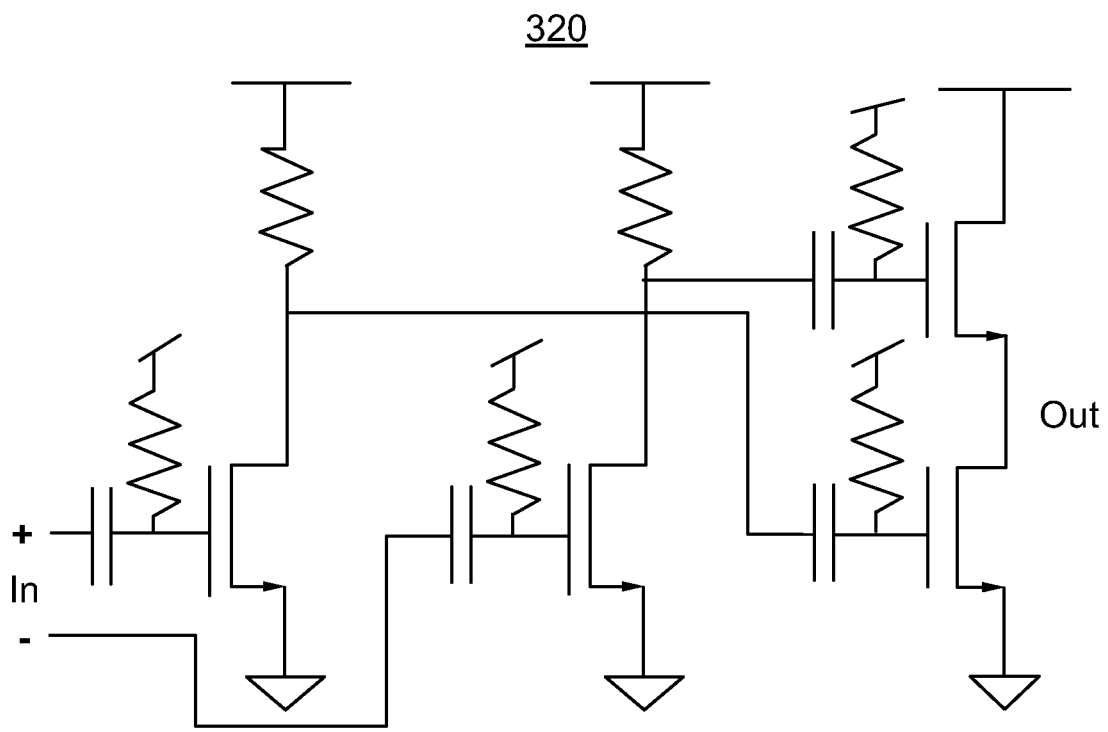

FIG. 3A illustrates a block diagram while FIGS. 3B-3F illustrate corresponding exemplary circuit diagrams for a differential configuration embodiment of a programmable delay device 300 in accordance with one or more embodiments. The programmable delay device 300 may, for example, be formed of CMOS circuitry on a single Si substrate, though other embodiments may, for example, employ circuitry formed of other IV, III-V, or II-VI semiconductor materials. An inductorless low noise amplifier (LNA) 304 receives an input RF signal 302 and provides both gain and differential conversion with NMOS bias sharing (see FIG. 3B) to reduce AC coupling capacitors for area savings. A device input buffer 306 provides isolation between the output of the LNA 304 and sampling switched capacitor storage elements 308 of the input sampling stage, and employs a push-pull output stage (see FIG. 3C). Each sampling switched capacitor storage element 308 employs a differential capacitor having, for example, a capacitance of 250 fF, for small area and sampling noise. The differential capacitors store corresponding input sampled signals. Intervening buffers 310 (see FIG. 3D), between the sampling switched capacitor storage elements 308 and the 186 delay switched capacitor storage elements 312 per programmable switched capacitor bank, each employs an NMOS common-source with diode-connected load for unity gain matching between the 8 paths. The intervening buffers 310 are preferably closely placed in the layout to limit gain mismatch induced signal distortion. Note that relatively long length devices are preferably employed for the intervening buffers 310 to reduce DC offset. The 186 delay switched capacitor storage elements 312 per programmable switched capacitor bank each employs a differential capacitor for storing corresponding delay sampled switched signals.

The delay buffers 314 of the programmable switched capacitor banks each employs a dynamic inverter clocked at both VSS and VDD by $PO_{x,y}$, where one of the 186 delay buffers 314 in each path are enabled at a time and all 186 delay buffers 314 share a self-biased inverter load 316 for common-mode stability in each of the 8 delay paths. As with the intervening buffers 310, the self-biased inverter load 316 likewise preferably employs a relative long device to reduce DC offset. An output reconstruction switch 318 outputs corresponding output reconstruction signals that are coupled to an optional intermediate buffer 320, which is followed by an output buffer 322. The output buffer 322 provides balun and matching operations and employs a common-source amplifier and push-pull output stage (see FIG. 3E) that outputs a reconstructed delayed output RF signal 324.

Clocking is provided from an input clock 330 at a frequency $F_S$ through a selectable clock divider 332 (for example, $F_{CLK}=F_S$, $2F_S$, or $4F_S$). This selectable clock divider 332 allows operation of the programmable delay device 300 over a wide range of applications operating at a wide range of clock frequencies $F_{CLK}$. While the programmable delay device 300 illustrated in FIG. 3A includes a selectable clock divider 332, other embodiments may not include any clock divider at this point in the clock tree, or may include a fixed divide-by-P clock as desired. An input divide-by-8 clock 334 generates the input sample clock signal $PI_x$. A programmable enable delay circuit 335 (see FIG. 3F) and an output divide-by-8 clock 336 generates the output reconstruction clock signal $PO_x$, the output reconstruction clock signal $PO_x$ being controlled independently of the input sample clock signal $PI_x$ for low timing skew at the input sampling stage (sampling switched capacitor storage elements 308) and the output reconstruction stage (output reconstruction switches 318) based on the clock signal from the selectable clock divider 332. In the more general case, the input divide-by-8 clock 334 and the output divide-by-8 clock 336 would both be divide-by-M clocks, while the programmable enable delay circuit 335 would implement from 1 to M fine delay steps.

The input sample clock signal $PI_x$ from the input divide-by-8 clock 334 is pulse extended to a 50% duty cycle by an input pulse extend clock 338. The input pulse extend clock 338 drives input divide-by-186 clocks 340, which generate the input clock signals $PI_{x,y}$, and which are placed inside each programmable switched capacitor bank area for standard logic implementation compatibility. The output reconstruction clock signal $PO_x$ from the output divide-by-8 clock 336 is pulse extended to a 50% duty cycle by an output pulse extend clock 342. The output pulse extend clock 342 drives output divide-by-186 clocks 344, which generate output clock signals $PO_{x,y}$, and which are placed inside each programmable switched capacitor bank area for standard logic implementation compatibility.

In the more general case, the input divide-by-186 clocks 340 and the output divide-by-186 clocks 344 would be divide-by-N clocks. While the programmable delay device 300 illustrated in FIG. 3A includes an input pulse extend clock 338 and an output pulse extend clock 342, other embodiments may not include one or both pulse extend clocks 338, 342, though this may require custom logic circuitry. While the programmable delay device 300 illustrated in FIG. 3A includes both an input divide-by-8 clock 334 and an output divide-by-8 clock 336, other embodiments may employ a single divide-by-8 clock (or more generally a divide-by-M clock), though this may result in clock timing skew issues.

The programmable delay in the illustrated embodiment operates as follows. The desired delay value Z will be an eleven bit value with the three least significant bits (LSBs) corresponding to the desired fine delay value and the eight most significant bits (MSBs) corresponding to the desired coarse delay value. The desired fine delay, implemented by the programmable enable delay circuit 335, provides from 1 to 8 steps (the three LSBs), with each fine delay step corresponding to a delay of $1/F_S$. The desired coarse delay, implemented by the eight programmable delay stages 130, provides from 1 to 186 steps (the eight MSBs), with each coarse delay step corresponding to a delay of $8/F_S$. The delay value Z, corresponding to delays of $8/F_S$ to $1480/F_S$ in $1/F_S$ increments, is entered using a serial programming interface 350 by an external programming source. The serial programming interface 350 outputs the desired fine delay value (the three LSBs) to the programmable enable delay circuit 335, while outputting the desired coarse delay value (the eight MSBs) to a digital counter in the enable timing circuit 352. The digital counter is enabled at the same time as the input divide-by-186 clocks 340, which generate the input clock signals $PI_{x,y}$. The digital counter counts up to the programmed desired coarse delay value. Once the digital counter reaches the programmed desired coarse delay value, the output divide-by-186 clocks 344, which generate output clock signals $PO_{x,y}$, are enabled, thereby causing the first sample to transfer to the corresponding output reconstruction switch 318. The output clock signals $PO_{x,y}$ continue to cause the transfer of samples to the output reconstruction switches 318 indefinitely and are delayed relative to the input clock signals $PI_{x,y}$ by the desired combined coarse plus fine delay.

Figure 3F:
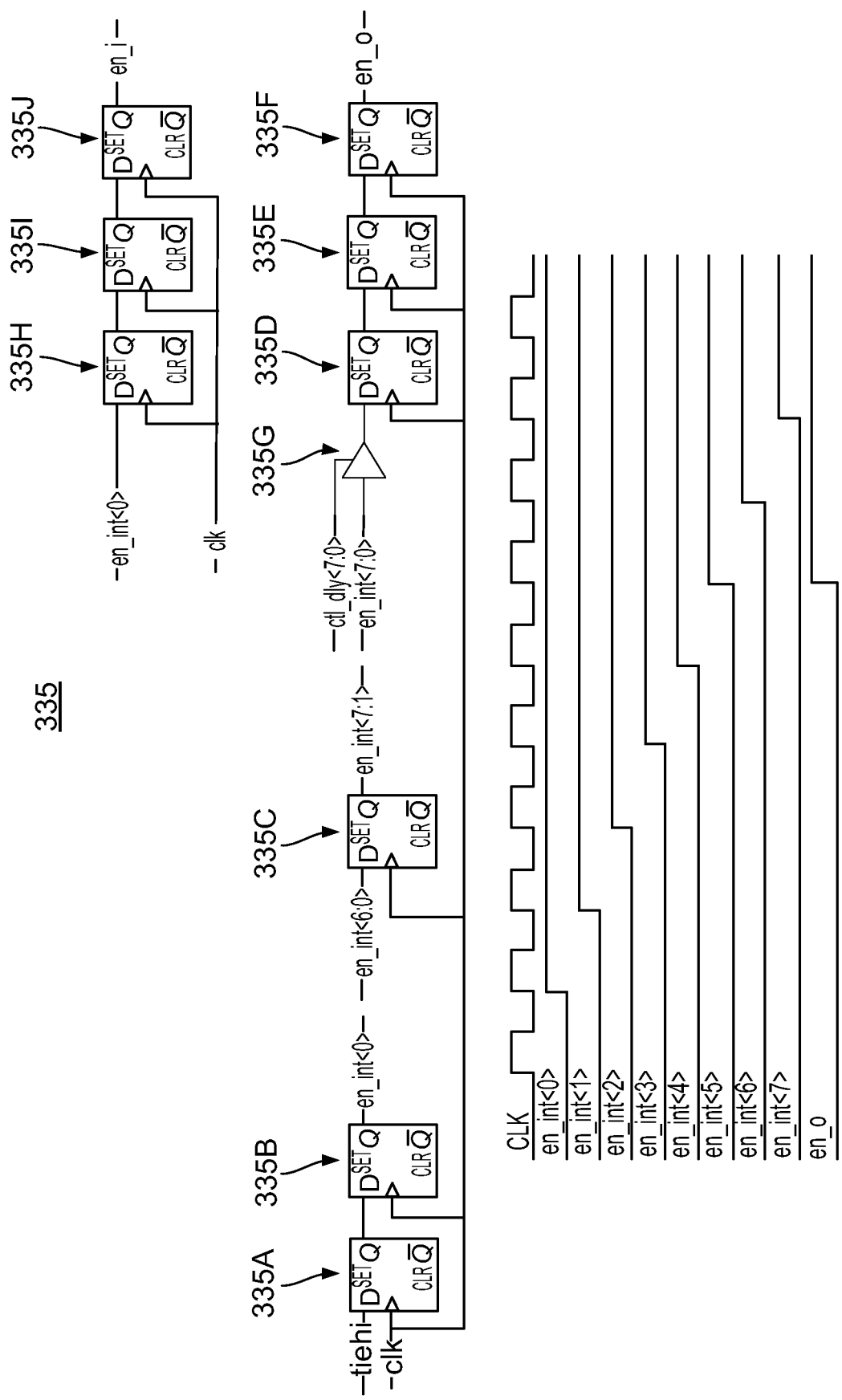

One implementation of the programmable enable delay device 335 is illustrated in FIG. 3F, with a corresponding timing diagram. The programmable enable delay device 335 includes a number of flip-flops 335A-335F and an eight input tri-state buffer 335G. The clock signal "clk" applied to each of flip-flops 335A-335F corresponds to the divided down clock signal received from the selectable clock divider 332. Flip-flop 335B outputs a first enable signal "en_int<0>" delayed by a single clock cycle, as illustrated in the timing diagram. Flip-flop 335C has seven inputs "en_int<6:0>" and seven outputs "en_int<7:1>" resulting in a total of eight delay signals "en_int<7:0>," as illustrated in the timing diagram. These eight delay signals "en_int<7:0>" are applied to eight corresponding inputs to the eight input tri-state buffer 335G. The other eight signals applied to the eight enables to the eight input tri-state buffer 335G are eight corresponding delay control signals "ctl_dly<7:0>." Only one of the eight delay control signals "ctl_dly<7:0>," corresponding to the desired fine delay value, will be high and thereby specify which of the eight possible delay signals "en_int<7:0>" is applied to flip-flop 335D. The output from flip-flop 335D is then rippled through flip-flops 335E and 335F before being output as the enable output signal "en_o." In the timing diagram, the delay control signal "ctl_dly<2>" was set high, i.e., the desired fine delay value was set to 2, resulting in a delay of $2/F_S$. This desired fine delay value corresponds to the three LSDs of the desired delay value Z described above. Note that as shown in the timing diagram, the enable output signal "en_o" goes high three clock cycles after "en_int<2>" due to the delay from the three flip-flops 335D-335F. The enable output signal "en_o," along with the clock signal "clk," i.e., the divided down clock signal received from the selectable clock divider 332, are supplied to the output divide-by-8 clock 336. Because the three flip-flops 335D-335F inherently delay the enable output signal "en_o" by three clock cycles, a substantially equally delayed enable input signal "en_i," likewise employing three flip-flops 335H-335J, is generated and supplied to the input divide-by-8 clock 334.

In at least one other embodiment, a single enable signal is employed and supplied to both the input divide-by-8 clock 334 and the output divide-by-8 clock 336. This single enable signal may, for example, correspond to the enable output signal "en_o." In this embodiment, the input divide-by-8 clock 334 and the output divide-by-8 clock 336 start in different initialization states corresponding to the desired fine delay value. For example, the input divide-by-8 clock 334 starts with $PI_1=1$, while the output divide-by-8 clock 336 starts with $PO_0=1$, resulting in a delay of $1/F_S$, i.e., the desired fine delay value was set to 1. As another example, and in the alternative, the output divide-by-8 clock 336 starts with $PO_3=1$, while the input divide-by-8 clock 334 starts with $PI_0=1$, resulting in a delay of $5/F_S$, i.e., the desired fine delay value was set to 5.

The programmable delay device 300 further includes an on-chip bandgap reference 360. This bandgap reference 360 provides all reference currents needed by the various RF circuits. The programmable delay device 300 includes the digital scan chain SPI interface 350, which enables programming of gain and calibration of the bandgap reference 360.

All publications, including but not limited to patents and patent applications, cited in this specification are herein incorporated by reference as though set forth in their entirety in the present application.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A programmable delay device comprising:
    an input sampling stage adapted to receive an input sampling clock at a frequency $F_S$ and an input RF signal, the input sampling stage including M sampling switched capacitor storage elements, the M sampling switched capacitor storage elements adapted to sequentially sample and hold a corresponding portion of the input RF signal, the thus sampled and held portions of the input RF signal being input sampled signals;
    a programmable delay stage including M programmable switched capacitor banks, each programmable switched capacitor bank including N delay switched capacitor storage elements, each delay switched capacitor storage element adapted to sample and hold a corresponding time interleaved portion of a corresponding input sampled signal, the thus sampled and held signals being delay sampled switched signals;
    a programmable enable delay circuit adapted to receive a desired fine delay value and the input sampling clock, the programmable enable delay circuit adapted to generate an enable output signal with a time delay based upon the desired fine delay value, an incremental fine delay value corresponding to $1/F_S$, the programmable enable delay circuit adapted to output the enable output signal and the input sampling clock as an output clock;
    an enable timing circuit adapted to receive a desired coarse delay value, the enable output signal, and the output clock, the enable timing circuit including a digital counter, the digital counter adapted to count to the desired coarse delay value, upon reaching the desired coarse delay value the enable timing circuit is adapted to output a corresponding output reconstruction clock, an incremental coarse delay value corresponding to $M/F_S$; and
    an output reconstruction stage including M output reconstruction switches, each output reconstruction switch coupled to a corresponding delay output switch, each output reconstruction switch adapted to output a corresponding time interleaved delay sampled switched signal based upon the output reconstruction clock, the thus output time interleaved delay sampled switched signals being output reconstruction signals, the output reconstruction stage adapted to output the output reconstruction signals in a sequential manner thereby generating a reconstructed output RF signal.

2. The programmable delay device of claim 1, further comprising a selectable clock divider adapted to receive an input clock, to divide the input clock by P, and to output the thus generated divide-by-P clock to the input sampling stage as the input sampling clock.

3. The programmable delay device of claim 1, wherein M is equal to or greater than 4.

4. The programmable delay device of claim 1, wherein each sampling switched capacitor storage element includes:
    an input sampling capacitor adapted to hold a corresponding input sampled signal; and
    an input sampling switch adapted to sequentially couple the input RF signal to the input sampling capacitor.

5. The programmable delay device of claim 1, wherein N is equal to or greater than 2.

6. The programmable delay device of claim 1, wherein each delay switched capacitor storage element includes:
    a switched bank sampling capacitor adapted to hold a corresponding delay sampled switched signal; and
    an input switched bank switch adapted to couple a corresponding input sampled signal to the switched bank sampling capacitor in a time interleaved manner.

7. The programmable delay device of claim 1, wherein the input sampling stage further includes M intervening buffers, each intervening buffer adapted to couple a corresponding sampling switched capacitor storage element to a corresponding programmable switched capacitor bank.

8. The programmable delay device of claim 1, wherein the programmable delay stage further includes M×N delay buffers, each delay buffer adapted to couple a corresponding delay switched capacitor storage element to a corresponding delay output switch.

9. The programmable delay device of claim 1, wherein the programmable enable delay circuit includes a plurality of flip-flops adapted to generate the enable output signal in accordance with the desired fine delay value, the enable output signal including an inherent delay due to one or more of the plurality of flip-flops.

10. The programmable delay device of claim 9, wherein the programmable enable delay circuit further includes one or more second flip-flops adapted to generate an enable input signal, the enable input signal including a second inherent delay due to the one or more second flip-flops, the second inherent delay due to the one or more second flip-flops substantially equal to the inherent delay due to the one or more of the plurality of flip-flops, the programmable enable delay circuit adapted to output the enable input signal to the input sampling stage.

11. The programmable delay device of claim 1,
wherein the programmable enable delay circuit is further adapted to output the enable output signal to the input sampling stage; and
wherein the input sampling stage and the enable timing circuit start in different initialization states corresponding to the desired fine delay value.

12. The programmable delay device of claim 1, wherein the output reconstruction stage further includes M self-biased inverter load, each self-biased inverter load adapted to couple a corresponding delay output switch to a corresponding output reconstruction switch.

13. The programmable delay device of claim 1:
wherein the input sampling stage further includes an input divide-by-M clock adapted to receive the input sampling clock, to divide the input sampling clock by M, and to output M thus generated input divide-by-M clocks;
wherein the programmable delay stage further includes M input divide-by-N clocks, each input divide-by-N clock adapted to receive a corresponding input divide-by-M clock, to divide the corresponding input divide-by-M clock by N, and to output N thus generated input divide-by-N clocks;
wherein each sampling switched capacitor storage element is adapted to be operated by a corresponding input divide-by-M clock; and
wherein each delay switched capacitor storage element is adapted to be operated by a corresponding input divide-by-N clock.

14. The programmable delay device of claim 13, wherein the input sampling stage further includes an input pulse extend clock adapted to receive the M input divide-by-M clocks, to lengthen a pulse length of each input divide-by-M clock, and to output M thus generated input pulse extended clocks to the M input divide-by-N clocks as corresponding input divide-by-M clocks.

15. The programmable delay device of claim 13,
wherein the enable timing circuit further includes an output divide-by-M clock adapted to receive the output clock, to divide the output clock by M, and to output M thus generated output divide-by-M clocks;
wherein the programmable delay stage further includes M output divide-by-N clocks, each output divide-by-N clock adapted to receive a corresponding output divide-by-M clock, to divide the corresponding output divide-by-M clock by N, and to output N thus generated output divide-by-N clocks;
wherein each output reconstruction switch is adapted to be operated by a corresponding output divide-by-M clock; and
wherein each delay output switch is adapted to be operated by a corresponding output divide-by-N clock.

16. The programmable delay device of claim 13, wherein the enable timing circuit further includes an output pulse extend clock adapted to receive the M output divide-by-M clocks, to lengthen a pulse length of each output divide-by-M clock, and to output M thus generated output pulse extended clocks as corresponding output divide-by-M clocks.

17. The programmable delay device of claim 1 further comprising a serial programming interface adapted to receive the desired fine delay value and the desired coarse delay value from an external programming source, to output the desired fine delay value to the programmable enable delay circuit, and to output the desired coarse delay value to the enable timing circuit.

18. The programmable delay device of claim 1, wherein at least a portion of the programmable delay device is implemented with CMOS circuitry.

19. The programmable delay device of claim 1, wherein at least a portion of the programmable delay device is implemented in either a single-ended configuration or a differential configuration.

20. The programmable delay device of claim 1, wherein the programmable delay device has an area efficiency of greater than 100 ns/mm$^2$.

* * * * *